(12) United States Patent  
Ruhl et al.

(10) Patent No.: US 8,384,132 B2
(45) Date of Patent: Feb. 26, 2013

(54) SYSTEM FOR SEPARATION OF AN ELECTRICALLY CONDUCTIVE CONNECTION

(75) Inventors: Guenther Ruhl, Regensburg (DE); Markus Hammer, Pielenhofen (DE); Regina Kainzbauer, Woerth an der Donau (DE)

(73) Assignee: Infineon Technologies AG, Neubiberg (DE)

( * ) Notice: Subject to any disclaimer, the term of this patent is extended or adjusted under 35 U.S.C. 154(b) by 86 days.

(21) Appl. No.: 12/853,955

(22) Filed: Aug. 10, 2010

(65) Prior Publication Data
US 2010/0320460 A1    Dec. 23, 2010

Related U.S. Application Data

(62) Division of application No. 11/544,294, filed on Oct. 5, 2006, now Pat. No. 7,799,583.

(30) Foreign Application Priority Data

Oct. 2, 2006 (DE) .................. 10 2006 046 790

(51) Int. Cl.
*H01L 23/52* (2006.01)
(52) U.S. Cl. .................. 257/209; 257/529; 438/601
(58) Field of Classification Search .................. None
See application file for complete search history.

(56) References Cited

U.S. PATENT DOCUMENTS

| | | | | |
|---|---|---|---|---|
| 5,578,861 | A * | 11/1996 | Kinoshita et al. | 257/529 |
| 5,635,010 | A * | 6/1997 | Pepe et al. | 156/264 |
| 5,821,160 | A * | 10/1998 | Rodriguez et al. | 438/601 |
| 6,046,488 | A * | 4/2000 | Kawasaki et al. | 257/529 |
| 6,127,721 | A * | 10/2000 | Narayan et al. | 257/529 |
| 7,799,583 | B2 * | 9/2010 | Ruhl et al. | 438/11 |
| 2002/0111004 | A1 * | 8/2002 | Suzuki et al. | 438/601 |
| 2003/0222330 | A1 * | 12/2003 | Sun et al. | 257/665 |
| 2005/0041976 | A1 * | 2/2005 | Sun et al. | 398/92 |
| 2005/0156276 | A1 * | 7/2005 | Sakoh | 257/529 |

* cited by examiner

*Primary Examiner* — Fei Fei Yeung Lopez
(74) *Attorney, Agent, or Firm* — Slater & Matsil, L.L.P.

(57) ABSTRACT

An integrated component includes a semiconductor substrate; at least one interconnect applied on the semiconductor substrate; an insulating layer applied on the at least one interconnect; and at least one opening through the insulating layer which interrupts the at least one interconnect into a first section and a second section.

28 Claims, 3 Drawing Sheets

SYSTEM FOR SEPARATION OF AN ELECTRICALLY CONDUCTIVE CONNECTION

PRIORITY CLAIM

This application is a Divisional of, and claims the benefit of priority from, U.S. application Ser. No. 11/544,294, filed Oct. 5, 2006, which claims the benefit of priority of German Patent Application No. 10 2006 046 790.6, filed Oct. 2, 2006, the contents of each of which are incorporated by reference hereby.

BACKGROUND

1. Technical Field

The present invention is related to electrically conductive connections in semiconductor systems. In particular, the present invention is related to isolating an electrically conductive connection.

2. Background Information

Integrated components contain a multiplicity of circuit elements, e.g. transistors, diodes, etc. In particular, the integrated component contains a semiconductor substrate, in or at which the circuit elements are formed. For connecting the circuit elements, the integrated component preferably contains one metallization level or a plurality of metallization levels. The integrated component is preferably part of a device which also contains a housing body and external connections besides the integrated component.

In integrated components, isolation elements are used for example in order, in the case of memory components, to select between defective circuit parts and functioning circuit parts. However, the isolation elements can also be used e.g. to store characteristic identifications in the integrated component, for example a component number. In particular, so-called fuses, that is to say metallic connections which are mounted selectively with the aid of a laser beam, are used as the isolation elements.

There is a need for a simply constructed integrated component with isolation devices which can be produced and isolated in a simple manner. In particular, surrounding circuit elements or other isolation elements ought not to be impaired in the course of isolation. Furthermore, the isolation elements are also intended to be able to contain very thick electrically conductive connections, as are required for example in power components. Moreover, there is a need for a method for isolating an electrically conductive connection.

BRIEF SUMMARY

The invention specifies an integrated component comprising: a semiconductor substrate; at least one interconnect applied on the semiconductor substrate; an insulating layer applied on the at least one interconnect; and [H] at least one opening through the insulating layer which interrupts the at least one interconnect into a first section and a second section.

The invention specifies an integrated component, comprising: an electrically insulating first layer region, an electrically conductive first section arranged at the first layer region, an electrically conductive second section arranged at the first layer region, a second layer region, a first cutout in the second layer region, and a second cutout extending from the first cutout as far as the first layer region, as far as the first section and as far as the second section.

The invention furthermore specifies a method comprising the steps of: providing a semiconductor substrate having at least one interconnect covered by an insulating layer, uncovering regions of the interconnect by irradiating the insulating layer, and isolating the interconnect into a first section and a second section by etching the uncovered regions of the interconnect.

The invention furthermore specifies a method comprising the steps of applying an electrically conductive layer region to an electrically insulating first layer region, applying an electrically insulating second layer region to the electrically conductive layer region, irradiating the second layer region, a first cutout being produced in the second layer region, the bottom of which cutout ends in or on the electrically conductive layer region, carrying out an etching process through the first cutout, a second cutout being produced, which isolates the electrically conductive layer region into two sections that are electrically insulated from one another.

BRIEF DESCRIPTION OF THE DRAWINGS

In the text below, embodiments of the invention are explained and exemplary embodiments of the invention are explained with reference to the figures, in which.

DETAILED DESCRIPTION

The following considerations, inter alia, can be taken as a basis. In specific devices, isolations of circuit parts by means of isolation elements, which can also be referred to as fuses, can become necessary. This can be effected by explosive vaporization of dielectric-enclosed interconnects having a specific cross section by means of heating through laser pulses. In order to minimize the attenuation of the laser power by the dielectric, the dielectric can be partially thinned. This thinning can require a phototechnology level with a subsequent etching step. However, specific technologies can involve the use of copper interconnects having high reflectivity and a high thickness, in the case of which a complete vaporization of the copper and thus a reliable opening of the fuses can no longer be ensured. Furthermore, material, e.g. copper, deposited at other locations of the device can, under certain circumstances, prevent a sufficient lateral electrical insulation, particularly in the case of high-voltage applications, with voltages of e.g. greater than 30 volts.

The problem can be solved by means of a process comprising two steps. In the first step, just the covering dielectric can be opened by means of one or a plurality of laser pulses. This can afford an advantage since a phototechnology level can be saved by means of the method. In the second sep, the exposed metal of the interconnect can be removed by means of an e.g. isotropic etching process. The isotropic etching process can be e.g. a wet-chemical etching process; by way of example, copper can be removed by means of a dilute aqueous ammonium peroxodisulfate solution. Furthermore, isolation elements made of other interconnect materials for which an e.g. isotropic wet or plasma etching process is available can also be isolated in a corresponding manner. Besides the reliable interruption of an isolation element interconnect having an arbitrary cross section, this process can have the advantage that deposited metal tracks can be removed on the surface of the dielectric and, consequently, a reliable lateral insulation can be ensured. Furthermore, as a result of the operation of opening solely the passivation and not the conductive connection as well, the number of required laser pulses can be minimized in comparison with opening the entire interconnect cross section. By way of example, just a single laser pulse per separation element can be necessary. The subsequent etching step can be noncritical and can thus be carried out on a batch installation. A significant throughput advantage can arise as a result.

The fundamental principle can thus be based on the separation of the isolation operation into the opening of the interconnect passivation and the isolation of the metal interconnect by means of an etching process. As a result, it can be possible, using a standard laser process, to open isolation elements made of metals that can be etched selectively with respect to the passivation and have an arbitrary thickness. The application of an etching process can furthermore afford the advantage that metal tracks deposited on the passivation surface during the laser vaporization can be removed and, consequently, the risk of lateral short circuits can be avoided.

By way of example, isolation elements, e.g. made of copper, with an interconnect thickness of 2.5 μm can be used in one technology. Said isolation elements are e.g. covered by at least 90 nm (nanometers) or 100 nm of $Si_3N_4$. The $Si_3N_4$ passivation can be opened by means of an IR laser pulse. The underlying interconnect, e.g. made of copper, can subsequently be etched through by means of an aqueous ammonium peroxodisulfate solution (0.5 to 5 percent by weight $(NH_4)_2S_2O_8$, e.g. at 40 to 80° C. (degrees Celsius), e.g. for 1 to 5 minutes). Subsequently rinsing with DI-$H_2O$ (deionized water) can then be effected. An underlying adhesion layer made e.g. of TaN/Ta can be etched in a second wet etching step by means of an aqueous NaOH/$H_2O_2$ solution (10 to 30 percent by weight NaOH, 1 to 5 percent by weight $H_2O_2$, e.g. at 60 to 90° C.).

A cross-sectional analysis of the resulting device can show, inter alia: small opening of the dielectric with simultaneous lateral undercutting, and/or lack of melt traces of the interconnect metal.

Consequently, the integrated component can comprise: an electrically insulating first layer region, which forms a support and is for example part of a substrate containing metallization levels and, in deeper layers, also a monocrystalline semiconductor region; an electrically conductive first section arranged at the first layer region, in particular on the first layer region or laterally with respect to the first layer region; an electrically conductive second section arranged at the first layer region, in which case both sections can preferably contain the same material composition; An electrically insulating second layer region, preferably arranged at a distance from the first layer region, for example a homogeneous layer or a layer stack; a first cutout in the second layer region, preferably a cutout produced by means of a laser, and a second cutout extending from the first cutout or from the second layer region as far as the first layer region, as far as the first section and as far as the second section.

Consequently, the interruption of an electrically conductive connection between the first section and the second section is achieved through the second cutout.

The second cutout can be etched through the first cutout, for example with the aid of a wet-chemical method or with the aid of a dry-chemical etching method.

In particular, an insulating layer, on which the second layer region is also arranged, can be arranged laterally with respect to the second cutout. This can be effected particularly in the case of a copper technology.

Moreover, the first section and preferably also the second section can contain copper. In particular, the two sections can comprise copper or a copper alloy containing at least 70 atomic percent of copper. Copper has a significantly higher electrical conductivity in comparison with aluminum, for example, and is thus suitable in particular for power components, that is to say components which can be used to switch currents of greater than 1 ampere or even greater than 10 amperes or which have switching powers of greater than 1 watt or even greater than 5 watts. Particularly stringent requirements are made of such components.

The first section and also preferably the second section can be arranged in the insulating layer. Thus, a single damascene method can be carried out, or a so-called dual damascene method, in which a via level and an interconnect level are produced simultaneously The layer thickness of the first section and preferably also the layer thickness of the second section can be greater than 2 micrometers. This is the case particularly with power components which are intended to switch high switching currents. The isolation element is used to carry out for example the fine adjustment of electrical parameters after the first functional measurement, e.g. setting of resistance values, capacitance values or of filter elements, in particular in connection with the tuning of resonant circuits.

As an alternative, a layer containing the second layer region can also be arranged laterally with respect to the first section or preferably also laterally with respect to the second section. This can be the case if an aluminum technology is used.

Consequently, the first section and preferably also the second section can contain aluminum. In particular, both sections can comprise aluminum or an aluminum alloy comprising at least 70 atomic percent of aluminum. Although aluminum has a lower electrical conductivity in comparison with copper, it can be bonded better, for example.

When using aluminum, too, the layer thickness of the first section or also of the second section can be greater than 2 micrometers, as is the case for example with power semiconductors.

The second layer region can have a layer thickness of greater than 500 nanometers or greater than 800 nanometers. The second layer region is thus suitable as a terminating passivation of the integrated component; that is to say, as a protective layer against ambient influences, such as moisture for example. The second layer region can also be so thick directly above the first section or the second section, and in particular also in the region in which a part of the connecting element has been removed. Consequently, no additional measures are necessary for reducing the layer thickness of the second layer region in these zones.

The second layer region can additionally contain a material which, in the event of irradiation with a wavelength within the range of 1000 to 1400 nanometers, that is to say in the infrared range, has a radiation absorption that is at least a factor of 5 or 10 higher than that of silicon dioxide, preferably silicon oxide produced by a TEOS method (tetraethyl orthosilicate) or a CVD method, for example. By way of example, the second layer region contains silicon nitride, silicon carbide, silicon oxynitride, etc. The high radiation absorption has the effect that the first cutout can be produced with a comparatively low laser power in a very reliable manner. Cutouts having an appropriately circular cross section and having smooth sidewalls can be produced. Said cutouts enable a highly uniform process implementation for producing the second cutout, particularly in comparison with the case where only cracks are produced in the second layer region or where the second layer region is removed along isolation element edges in a more or less undefined manner.

The second layer region can contain a layer made of the highly absorbent materials mentioned, the layer having a thickness of at least 90 nanometers or at least 400 nanometers. The layer thus affords a sufficient thickness for a passivation.

However, the second layer region can also contain a layer stack comprising, for example: a lower layer having a high radiation absorption coefficient, a middle layer having a low radiation absorption coefficient, e.g. silicon dioxide layer, and an upper layer made of a material having a high radiation absorption coefficient, in particular made of silicon nitride.

Moreover, an electrically conductive bonding support, which is also referred to as a bonding pad, can be arranged in the same layer as the first section and, if appropriate, also the second section. The bonding support can have the same material composition as the first section, that is to say comprise, in particular, copper or else aluminum. The bonding support is optionally present, particularly when the isolation element can e.g. be programmed independently of test steps, as is the case e.g. when selecting one of a plurality of test circuits.

The bonding support is preferably protected with an additional electrically conductive layer during the etching of the second cutout. Said layer is for example a gold layer, or a layer stack, for example with a nickel-phosphorus layer.

The first cutout can have a form of a truncated cone, with inclined sidewalls. The truncated cone form can be produced by means of a laser beam, e.g. if the second laser region contains highly absorbent materials.

Moreover, the component can comprise at least one isolation element which has not been isolated. Accordingly, there is no first cutout and also no second cutout at said isolation element.

Moreover, a method for isolating an electrically conductive connection is specified, comprising the steps of applying an electrically conductive layer region to an electrically insulating first layer region, applying an electrically insulating second layer region on the electrically conductive layer region, irradiating the second layer region, in which case preferably a first cutout can be produced in the second layer region. The bottom of the first cutout can end on the electrically conductive layer region or in the electrically conductive layer region, preferably in the upper third of the electrically conductive layer region. To put it another way, therefore, the electrically conductive layer region is not completely severed during irradiation. This permits the electrically conductive layer region to be made very thick, e.g. greater than 2 micrometers, or permits the use of a comparatively low laser power; carrying out an etching process through the first cutout, in which case preferably a second cutout can be produced, which isolates the electrically conductive layer region into two sections that are electrically insulated from one another.

Planarization can be effected, preferably by means of a CMP method (chemical mechanical polishing), after the application of the electrically conductive layer region and prior to the application of the second layer region. The second layer region can thus be applied on one level, preferably with a uniform layer thickness.

The layer thickness of the second layer region can be greater than 400 nanometers, so that the second layer region is suitable as passivation of the component.

The second layer region can be applied without plasma or using a plasma having a medium power. In particular, the power is lower at least by half than when using a plasma having a high electrical power, as is the case in an HDP method (high density plasma). An HDP method has, for example, a removal component alongside the coating component. Such a removal component is not necessary; however, if highly absorbent materials are used in the second layer region.

Thus, the second layer region can contain a material which, in the event of irradiation, has an absorption which is greater at least by a factor of 5 or by a factor of 10, if appropriate even by a factor of 20, than the absorption of silicon dioxide during said irradiation. By way of example, reference is made to silicon dioxide which is likewise contained in the second layer region.

The irradiation can be carried out by means of a laser beam, the laser energy lying for example within the range of 0.2 to 2.7 microjoules. An infrared laser can preferably be used, for example having a wavelength within the range of 1000 to 1400 nanometers. Particularly suitable wavelengths can be 1047 nanometers or 1321 nanometers. The diameter of the laser beam can lie within the range of 1 micrometer to 10 micrometers. A laser beam can be used which produces a hole having a diameter within the range of 1 micrometer to 10 micrometers.

The second cutout can be produced wet-chemically, in which case a multistage etching process can be used for example in order to remove mutually different electrically conductive materials, for example the main material and a barrier layer or, if appropriate, also antireflection layers made of metallic material.

So far as the word "can" is used in this description, both the possibility and the actual technical form of realization are meant. Exemplary embodiments are explained below, but they are not intended to restrict the invention.

Figure 1:
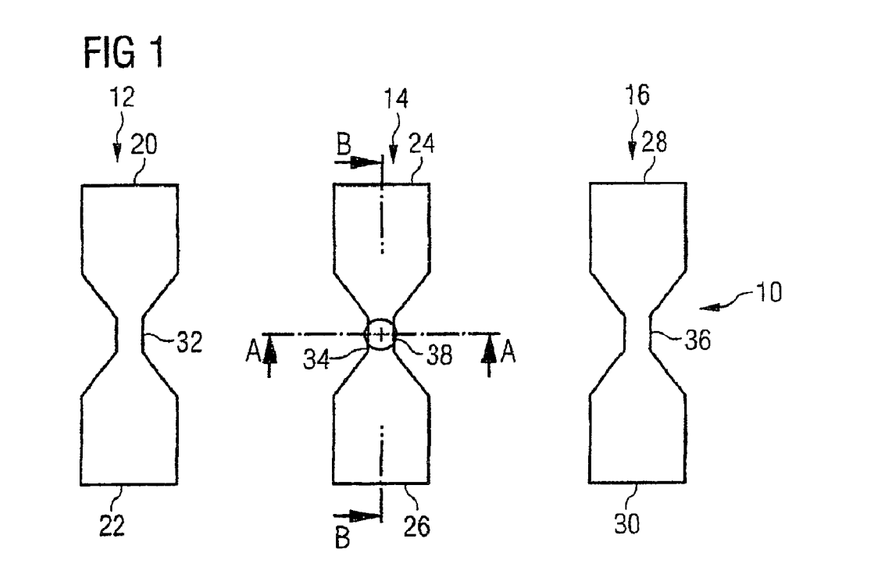
FIGS. 1 and 2 show a plan view of isolation elements.

FIG. 1 shows a plan view of an isolation element series 10, which is also referred to as an isolation element bank. In the exemplary embodiment, the isolation element series 10 contains three isolation elements 12, 14 and 16. Prior to isolation, the isolation elements 12 to 16 have the same construction, so that the construction of the isolation element 12 will be explained as representative of the construction of all the isolation elements 12 to 16.

The isolation element 12 contains an electrically conductive first connection 20 adjoined by a via in a lower metallization level. The isolation element 12 tapers in wedge-shaped fashion from the connection 20 toward a central section 32. The central section 32 has a uniform width as far as a section from which the isolation element 12 expands again toward an electrically conductive second connection 22. Below the connection 22 as well there is a via situated in a lower metallization level. The isolation element 14 and 16 likewise contains a first connection 24 and 28, respectively, a central section 34 and 36, respectively, and also a second connection 26 and 30, respectively.

It is assumed in the exemplary embodiment that only the central isolation element 14 is intended to severed, while the left-hand isolation element 12 and the right-hand isolation element 16 are not intended to be severed. With the aid of a laser beam, a cutout 38 is produced above the central section 34 in a layer (not illustrated) covering the isolation elements 12 to 16. A cross section A-A and a longitudinal section B-B at the cutout 38 are explained in more detail below with reference to FIGS. 3A to 3E and FIG. 4, respectively.

Figure 2:
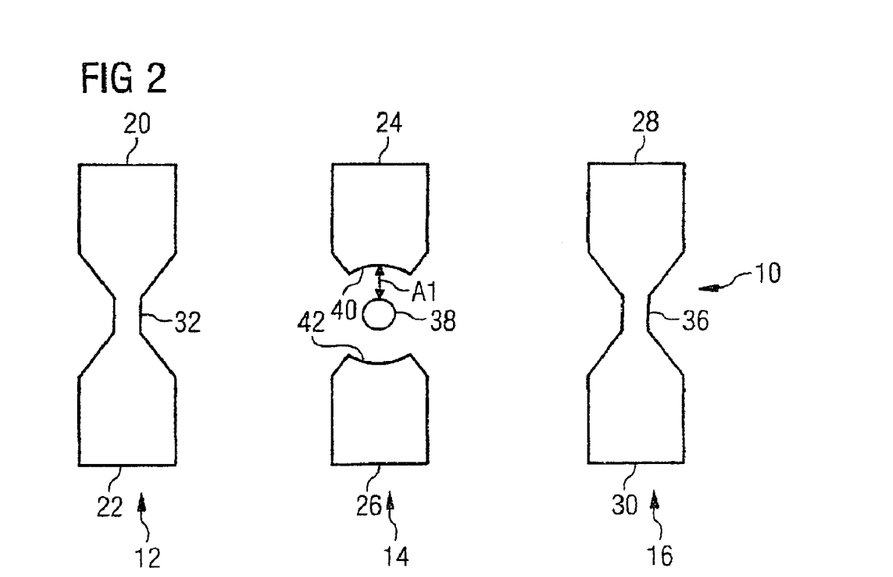

As is illustrated in FIG. 2, a wet-chemical etching process is carried out after the production of the cutout 38. In this case, the etching liquid penetrates through the cutout 38 and passes to the central section 34, which is etched away. The etching is continued e.g. below the layer region containing the cutout 38, etching areas 40 and 42 arising, which are at a distance A1 away from the cutout 38 in the case of the plan view. The distance A1 amounts to at least 200 nanometers, for example, and is typically at least as large as the layer thickness of the connection 24 owing to the e.g. anisotropic etching process during the isolation of the isolation element 14.

However, the central sections 32 and 36 of the adjacent isolation elements 12 and 16 are still covered by the layer region that is not illustrated in FIG. 2, and are therefore not etched.

In other exemplary embodiments there are no constrictions in the central sections. The isolation elements have a uniform width. Exemplary embodiments in which the isolation elements 12 to 16 are produced on the basis of copper or alternatively on the basis of aluminum are explained below.

Figure 3A:
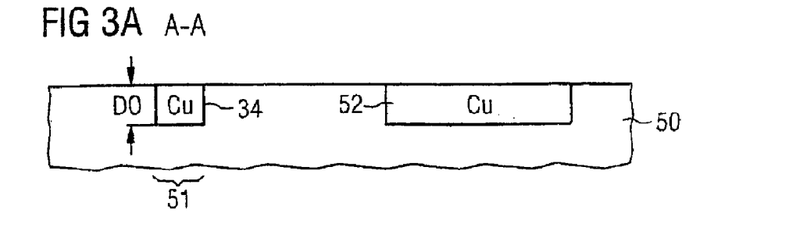
FIGS. 3A to 3E show production stages in the production of an isolation element made of copper.

FIG. 3A shows a cross section A-A, see FIG. 1, of a production stage for producing the copper-based isolation element 14. As is illustrated in FIG. 3A, the isolation element 14 including its central section 34 and also a bonding support 52 are produced in an insulating layer 50 for example with the aid of a single damascene technique. Barrier layers between copper and the insulating layer 50 are not illustrated in FIG. 3A. A layer thickness D0 of the copper in the insulating layer 50 is for example more than 2 micrometers, in the exemplary embodiment 2.5 micrometers.

The copper is deposited in cutouts of the insulating layer 50 which have been produced with the aid of a photolithographic method, for example. The copper is deposited electrogalvanically, for example. The copper deposition is followed by planarization, the state illustrated in FIG. 3A arising.

Figure 3B:
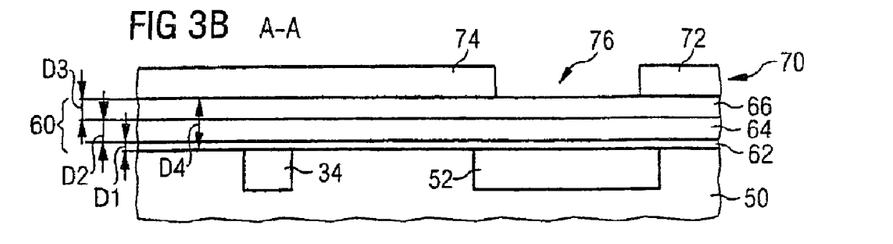

As is illustrated in FIG. 3B, after planarization, a silicon nitride layer 62 having a layer thickness D1 is applied. The layer thickness D1 lies for example within the range of 75 nanometers to 250 nanometers, and in the exemplary embodiment is 100 nanometers. After the deposition of the silicon nitride layer 62, a silicon dioxide layer 64 is deposited, for example by means of a CVD method (chemical vapor deposition). In the exemplary embodiment, the silicon dioxide layer 64 has a layer thickness D2 of 500 nanometers. In other exemplary embodiments, the silicon dioxide layer 64 has a layer thickness D2 within the range of 250 nanometers to 750 nanometers.

Afterward, a further silicon nitride layer 66, which has a layer thickness D3 of 500 nanometers in the exemplary embodiment, is deposited onto the silicon dioxide layer 64. In other exemplary embodiments, the layer thickness D3 lies within the range of 250 nanometers to 750 nanometers. The layers 62 to 66 thus form a passivation layer stack 60 having a layer thickness D4, which is 1.1 micrometers in the exemplary embodiment. In further exemplary embodiments, the layer thickness D4 lies within the range of 750 nanometers to 1.5 micrometers.

The silicon nitride layer 62 serves in particular as a barrier layer which is intended to prevent the copper from diffusing into the silicon dioxide layer 64.

As is furthermore illustrated in FIG. 3B, a resist 70, for example a photoresist, is applied after the application of the silicon nitride layer 66. As an alternative, use can also be made of hard masks which are patterned using a photoresist. The resist layer 70 is patterned and developed by means of a photolithographic method, a cutout 76 being produced above the bonding support 62. Above the central section 34, however, no cutout is produced in the resist layer 70. Resist regions 72 and 74 of the resist layer 70 are situated on the right and on the left alongside the cutout 76.

Figure 3C:
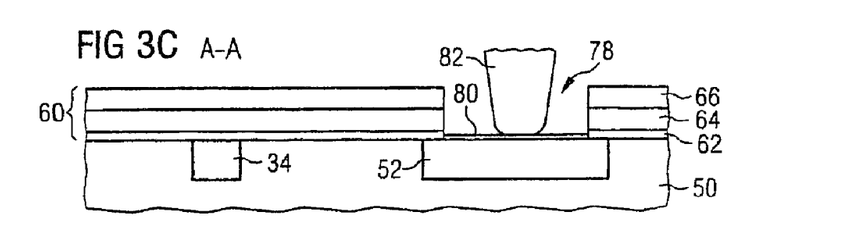

Afterward, with the aid of a dry-chemical etching method or alternatively also with the aid of a wet-chemical etching method, the layer stack 60 is patterned in accordance with the resist layer 70, a cutout 78 being produced, which reaches as far as the bonding support 52, see FIG. 3C.

As is furthermore shown in FIG. 3C, the resist layer 70 or the residues thereof is/are removed. A protective layer 80 is then applied to the uncovered regions of the bonding support 52. The protective layer 80 is preferably electrically conductive. In the exemplary embodiment, a gold layer 80 having for example a layer thickness within the range of 50 to 100 nanometers is applied. As an alternative, a layer stack is used as the protective layer 80, for example containing a nickel-phosphorus layer and a gold layer.

A test step is subsequently carried out, with the aid of which circuit elements or circuit parts of the integrated component in which the bonding support 52 is situated are tested. For this purpose, by way of example, a test needle 82 is pressed against the gold layer 80.

Depending on the test result, a decision is taken as to which isolation elements 12 to 16 are to be isolated and which are to remain connected. As mentioned above, only the isolation element 14 is isolated in the exemplary embodiment, with the result that, in particular, the central section 34 must be removed.

Figure 3D:
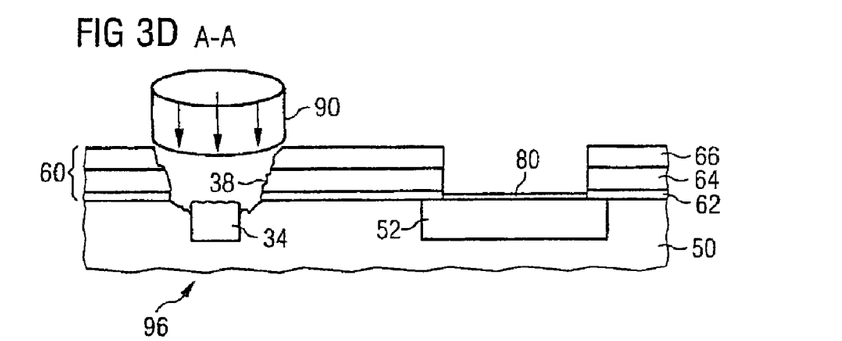

As is illustrated in FIG. 3D, the cutout 38 above the central section 34 is introduced into the layer stack 60 with the aid of a laser beam 90. The laser power and the irradiation duration are chosen such that the central section 34 is melted only to an insignificant extent during the laser irradiation.

Figure 3E:
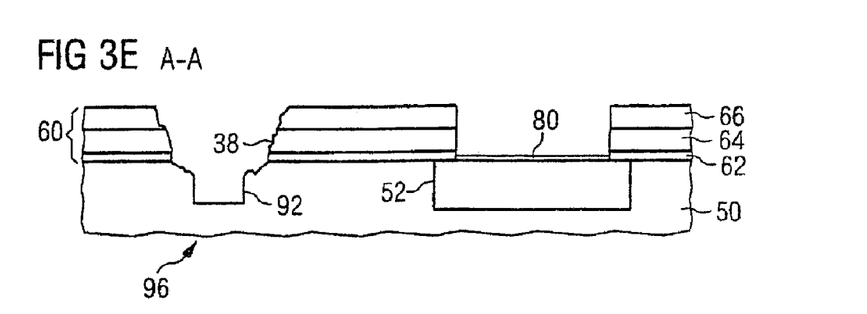

As is illustrated in FIG. 3E, the central section 34 is subsequently removed with the aid of a wet-chemical etching method, a cutout 92 arising, which has the form of the removed central section 34 at least in a central part. During the etching process, the gold layer 80 protects the bonding support 52 against the etching solution.

An integrated component 96 containing an isolated isolation element 14 has thus been produced. The subsequent method steps involve fitting bonding connections, for example, which lead from the bonding support 52, 80 to a connection frame or alternatively to a component carrier, e.g. leadframe. In a further method step, the integrated component 96 is provided with a housing body, for example, in particular by a compression molding method. In this case, housing material can penetrate into the cutout 38 and, if appropriate, also into the cutout 92. As an alternative, by way of example, air remains in the cutout 38 or 92.

In other exemplary embodiments, the isolation elements 12 to 16 are produced in the same way, but the integrated component 96 is mounted in a different way, for example with the aid of the flip-chip technique by means of soldering connections or by means of diffusion bonding or by means of other types of connection.

Figure 4:
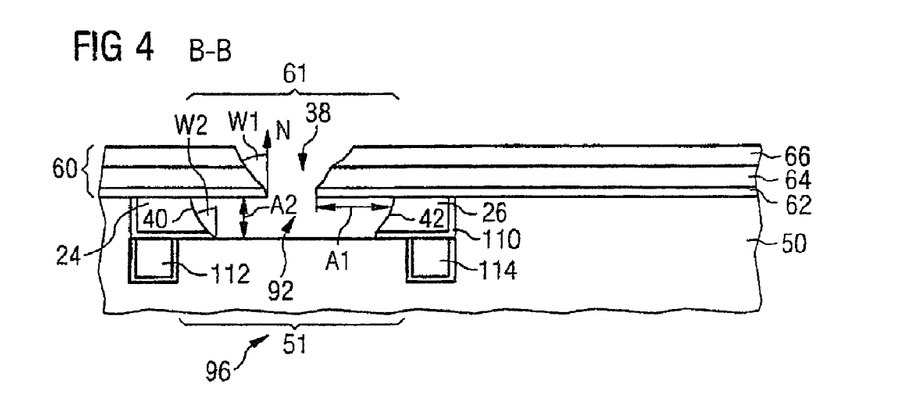
FIG. 4 shows a longitudinal section through a copper-based isolation element.

FIG. 4 shows the longitudinal section B-B, see FIG. 1, through the isolation element 14 after isolation, the isolation element 14 being produced on the basis of copper. The high degree of undercutting of the layer stack 60 is discernible, see distance A1 or else FIG. 2. Moreover, FIG. 4 illustrates vias 112 and 114 below the connections 24 and 26, respectively. Furthermore, a barrier material 110 surrounding the connections 24 and 26 is illustrated. By way of example, tantalum nitride or a double layer comprising tantalum and tantalum nitride is used as barrier material. In order to remove the barrier layer 110, a two-stage wet-chemical etching process is likewise carried out for example during the production of the cutout 92.

FIG. 4 additionally illustrates a normal N to the top area of the connection 24. The direction of the normal N also matches the direction of the normal to the active area of a semiconductor substrate contained in the component 96, e.g. a monocrystalline or polycrystalline silicon substrate or a compound semiconductor substrate. An angle W1 between the normal N and a lateral area of the cutout 38 and also an angle W2 between the normal and the etching area 40 of the section 24 are furthermore illustrated. The angles W1 and W2 preferably have values within the range of 30° to 60°.

The cross section through an aluminum-based isolation element 14 has a similar appearance apart from the differences explained below. In particular, there is likewise the undercutting represented by the distance A1.

FIG. 4 additionally illustrates a distance A2 between a layer region 51 of the insulating layer 50 and a layer region 61 of the passivation layer stack. The distance A2 corresponds to the thickness D0 of the isolation element 14.

Figure 5:
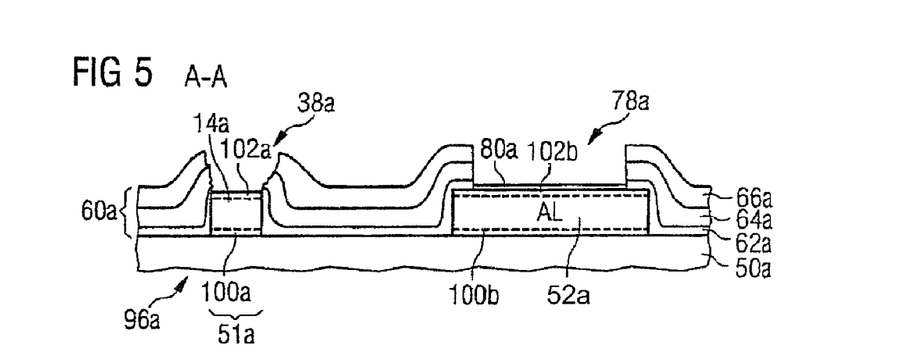
FIG. 5 shows an alternative exemplary embodiment of an isolation element made of aluminum.

FIG. 5 shows an integrated component 96a, in the case of which an upper metallization layer based on aluminum is produced. The following are applied successively on an insulating layer 50a an optional adhesion layer comprising sections 100a, 100b, for example made of titanium nitride, an aluminum layer comprising layer regions 14a and 52a, in which case the layer region 14a is later intended to form a central section of the isolation element 14 and the layer region 52a is later intended to form a bonding support, and an anti-reflection layer comprising layer regions 102a, 102b.

The antireflection layer is optional, particularly in the case of large structure widths for the structures to be produced. In the exemplary embodiment, the antireflection layer likewise comprises titanium nitride.

Afterward, a resist layer (not illustrated in FIG. 5) is applied and patterned, resist regions remaining above the central section 14a and above the bonding support 52a. The aluminum is subsequently patterned, for example by means of a dry-chemical etching method. The resist layer is then removed. FIG. 5 additionally shows a layer region 51a of the insulating layer 50a. The layer region 51a is situated below the isolation element 50.

A passivation layer stack 60a is subsequently produced, which contains the same layers as the layer stack 60, so that reference is made to the explanations concerning FIGS. 3A to 4. In particular, the layer stack 60a likewise contains a silicon nitride layer 62a, a silicon dioxide layer 64a and a silicon nitride layer 66a. Reference is made to the above explanations with regard to the layer thicknesses, too.

After the application of the silicon nitride layer 66a, a resist layer is once again produced and patterned with the aid of a photolithographic method and also a development step, a cutout being produced above the bonding support 52a. Etching is subsequently effected, a cutout 78a being produced, which reaches as far as the bonding support 52a or as far as the layer region 102b. A protective layer 80a is then once again applied, for example a gold layer. The test step is then once again carried out in order to ascertain which isolation elements 12 to 16 are to be isolated.

A cutout 38a is produced above the central section 14a with the aid of a laser beam. The following are then removed with the aid of an e.g. three-stage wet-chemical etching process the layer region 102a made of titanium nitride, for example using hydrogen peroxide and ammonia solution in a ratio of 2:1, the central section 14a made of aluminum, for example with the aid of nitric acid and phosphoric acid in a ratio of 20:1, and the layer region 100a made of titanium nitride once again using hydrogen peroxide and ammonia solution in a ratio of 2:1.

As an alternative, a single-stage wet-chemical etching process which is suitable for both of the materials can also be carried out.

In other exemplary embodiments, the central section 14 or 14a is removed with the aid of dry etching methods. Typical selectivities of aluminum with respect to silicon nitride or with respect to silicon dioxide are approximately 3 to 2, so that critical damage to the insulating material may perfectly well occur in the case of high metal thicknesses, for which reason wet-chemical methods can preferably be applied.

In particular, isotropic etches can preferably be applied because by this means, in the event of only partial opening of the insulating layer by means of e.g. the laser beam or in the event of an offset of the opening, the isolation can nevertheless be carried out reliably and in particular completely. Thus, in one exemplary embodiment, the offset of the center of the opening with respect to the center line of the interconnect is so large that more than ⅓ of the width of the section of the interconnect to be removed or even more than ½ of the width of said section is still completely covered by the insulating layer, in particular at the uncovered zone of said section. Consequently, beam positioning devices with greater positioning tolerances can be used or the beam can be positioned more rapidly and in return less accurately.

In another alternative, the connections 24, 26 are completely removed during the wet-chemical etching.

In another alternative, copper is patterned subtractively and covered with an insulating layer or an insulating layer stack.

It is therefore intended that the foregoing detailed description be regarded as illustrative rather than limiting, and that it be understood that it is the following claims, including all equivalents, that are intended to define the spirit and scope of this invention.

We claim:

1. An integrated component comprising:
a semiconductor substrate;
at least one interconnect overlying the semiconductor substrate;
an insulating layer overlying the at least one interconnect; and
at least one opening through the insulating layer which divides the at least one interconnect into a first section and a second section, wherein the opening undercuts the insulating layer, wherein the first section and the second section have concave sidewalls, and wherein the insulating layer comprises a material which has a radiation absorption in a wavelength within a range of 1000 to 1400 nanometers that is at least a factor of 10 higher than that of silicon dioxide.

2. The component of claim 1, wherein the first section and the second section form an isolation element configured to record a characteristic identification of the component or for a selection of a subcircuit sub-circuit of the component or for a fine adjustment of electrical parameters.

3. The component of claim 2, wherein the isolation element is configured for a selection of a test circuit or for the fine adjustment after a first functional measurement.

4. The component of claim 1, wherein the insulating layer comprises a planar layer.

5. The component of claim 1, wherein the first section comprises copper or a copper alloy comprising at least 70 atomic percent of copper and a layer thickness of the first section is greater than 2 micrometers.

6. The component of claim 1, further comprising at least one further isolation element that records a characteristic identification of the component or for a selection of a subcircuit of the component or for a fine adjustment of electrical parameters, said further isolation element not being isolated.

7. The component of claim 1, wherein the insulating layer is arranged laterally with respect to the first section.

8. The component of claim 1, wherein the first section comprises aluminum or an aluminum alloy comprising at least 70 atomic percent of aluminum.

9. The component of claim 1, wherein a layer thickness of the first section is greater than 2 micrometers.

10. The component of claim 1, wherein the insulating layer above the first section has a layer thickness of greater than 500 nanometers.

11. The component of claim 1, wherein the insulating layer comprises:
a first layer comprising silicon nitride;
a second layer comprising silicon dioxide; and
a third layer comprising silicon nitride.

12. The component of claim 1, further comprising an electrically conductive bonding support arranged in a same layer as the first section, and comprising a same material composition as the first section.

13. The component of claim 1, wherein one part of the opening has an inclination within a range of 30° to 60° with respect to a normal to a top area of the first section.

14. An integrated component, comprising:
an electrically insulating first layer region;
an electrically conductive first section arranged directly adjacent the first layer region;
an electrically conductive second section arranged directly adjacent the first layer region;
an electrically insulating second layer region, wherein the second layer region comprises
a first layer comprising silicon nitride;
a second layer comprising silicon dioxide; and
a third layer comprising silicon nitride;
a first cutout in the second layer region; and
a second cutout extending from the first cutout at least as far as the first layer region, at least as far as the first section and at least as far as the second section.

15. The component of claim 14, further comprising an insulating layer including the electrically insulating first layer region arranged laterally with respect to the second cutout.

16. The component of claim 14, wherein a layer containing the electrically insulating second layer region is arranged laterally with respect to the first section or laterally with respect to the second cutout.

17. The component of claim 14, wherein the second layer region has a layer thickness of greater than 500 nanometers.

18. The component of claim 14, wherein the first cutout has a form of a truncated cone, with inclined sidewalls, with an inclination within a range of 30° to 60° with respect to a normal to a top area of the first section, and wherein, at least a central section of the second cutout is parallelepipedal.

19. The component of claim 14, wherein the first section and the second section comprise copper, copper alloy comprising at least 70 atomic percent of copper, aluminum, or aluminum alloy comprising at least 70 atomic percent of aluminum.

20. An integrated component comprising:
a semiconductor substrate;
at least one interconnect overlying the semiconductor substrate;
an insulating layer overlying the at least one interconnect; and
at least one opening through the insulating layer which divides the at least one interconnect into a first section and a second section, wherein the first section and the second section comprise concave sidewalls, and wherein the first section and the second section have inclined sidewalls, with an inclination within a range of 30° to 60° with respect to a normal to a top area of the first section.

21. An integrated component, comprising:
an electrically insulating first layer region;
an electrically conductive first section arranged at the first layer region;
an electrically conductive second section arranged at the first layer region;
an electrically insulating second layer region;
a first cutout in the electrically insulating second layer region; and
a second cutout extending from the first cutout at least as far as the first layer region, at least as far as the first section and at least as far as the second section, wherein the first cutout has a form of a truncated cone with inclined sidewalls, with an inclination within a range of 30° to 60° with respect to a normal to a top area of the first section, and wherein at least a central section of the second cutout is parallelepipedal.

22. The component of claim 21, wherein the second layer region comprises a material which has a radiation absorption in a wavelength within the range of 1000 to 1400 nanometers that is at least a factor of 10 higher than that of silicon dioxide.

23. The component of claim 21, wherein the second layer region comprises at least one layer including a material which has a radiation absorption in a wavelength within a range of 1000 nanometers to 1400 nanometers that is at least a factor of 5 higher than that of silicon dioxide.

24. An integrated component comprising:
a semiconductor substrate;
at least one interconnect overlying the semiconductor substrate;
an insulating layer overlying the at least one interconnect, wherein the insulating layer comprises
a first layer comprising silicon nitride;
a second layer comprising silicon dioxide; and
a third layer comprising silicon nitride; and
at least one opening through the insulating layer which divides the at least one interconnect into a first section and a second section, wherein the opening undercuts the insulating layer.

25. An integrated component comprising:
a semiconductor substrate;
at least one interconnect overlying the semiconductor substrate;
an insulating layer overlying the at least one interconnect; and
at least one opening through the insulating layer which divides the at least one interconnect into a first section and a second section, wherein the opening undercuts the insulating layer, and wherein one part of the opening has an inclination within a range of 30° to 60° with respect to a normal to a top area of the first section.

26. An integrated component comprising:
a semiconductor substrate;
at least one interconnect overlying the semiconductor substrate;
an insulating layer overlying the at least one interconnect; and
at least one opening through the insulating layer which divides the at least one interconnect into a first section and a second section, wherein the opening undercuts the insulating layer, wherein the first section and the second section have concave sidewalls, wherein the insulating layer comprises at least one layer including a material which has a radiation absorption in a wavelength within a range of 1000 nanometers to 1400 nanometers that is at least a factor of 5 higher than that of silicon dioxide, and wherein the insulating layer has a thickness of at least 100 nanometers.

27. An integrated component comprising:
a semiconductor substrate;
at least one interconnect overlying the semiconductor substrate;
an insulating layer overlying the at least one interconnect, wherein the insulating layer comprises a first layer comprising silicon nitride, a second layer comprising silicon dioxide and a third layer comprising silicon nitride; and
at least one opening through the insulating layer which divides the at least one interconnect into a first section and a second section, wherein the opening undercuts the insulating layer, and wherein the first section and the second section have concave sidewalls.

28. An integrated component, comprising:
an electrically insulating first layer region;
an electrically conductive first section arranged directly adjacent the first layer region;
an electrically conductive second section arranged adjacent the first layer region;
an electrically insulating second layer region, wherein the second layer region comprises
 a first layer comprising silicon nitride;
 a second layer comprising silicon dioxide; and
 a third layer comprising silicon nitride;
a first cutout in the second layer region;
a second cutout extending from the first cutout at least as far as the first layer region, at least as far as the first section and at least as far as the second section; and
an insulating layer including the electrically insulating first layer region arranged laterally with respect to the second cutout.

* * * * *

UNITED STATES PATENT AND TRADEMARK OFFICE
CERTIFICATE OF CORRECTION

PATENT NO. : 8,384,132 B2
APPLICATION NO. : 12/853955
DATED : February 26, 2013
INVENTOR(S) : Ruhl et al.

It is certified that error appears in the above-identified patent and that said Letters Patent is hereby corrected as shown below:

In the Claims

In Col. 10, line 50, claim 2, delete "subcircuit".

Signed and Sealed this
Sixteenth Day of July, 2013

Teresa Stanek Rea
*Acting Director of the United States Patent and Trademark Office*